United States Patent [19]

Gal

[11] 4,388,700
[45] Jun. 14, 1983

[54] NUCLEATION BUBBLE GENERATOR FOR BUBBLE DOMAIN DEVICES

[75] Inventor: Laszlo V. Gal, West Covina, Calif.

[73] Assignee: Rockwell International Corporation, El Segundo, Calif.

[21] Appl. No.: 239,235

[22] Filed: Mar. 2, 1981

[51] Int. Cl.³ .............................................. G11C 19/08
[52] U.S. Cl. ..................................................... 365/11
[58] Field of Search .............................. 365/11, 12, 39

[56] References Cited

U.S. PATENT DOCUMENTS 4,257,109  3/1981  Schwartz .............................. 365/11

Primary Examiner—James W. Moffitt
Attorney, Agent, or Firm—H. Fredrick Hamann; Daniel R. McGlynn

[57] ABSTRACT

A magnetic bubble domain device nucleation source for producing magnetic bubble domains is disclosed, in which bubble domains along with possibly unwanted duplicate bubble domains are produced in response to a current pulse. A first bubble domain guide structure is provided which coupled and disposed directly adjacent the nucleator and defines a first bubble domain propagation path for guiding the movement of generated bubble domains in response to a cyclical change in orientation of a reorientating field within the plane of the magnetic layer. This first guide structure functions to receive bubble domains representative of information. More particularly, a second bubble domain guide structure is provided also disposed directly adjacent the nucleator and the first bubble domain guide structure. The second bubble domain guide structure is operative for guiding the movement of the unwanted duplicate bubble domains produced in the layer by the nucleator simultaneously with the production of ones of the bubble domains which are representative of information and transferred to the first bubble domain guide structure. The second bubble domain guide structuring functions to receiving the unwanted duplicate bubble domains and eliminate them.

4 Claims, 1 Drawing Figure

U.S. Patent
Jun. 14, 1983
4,388,700
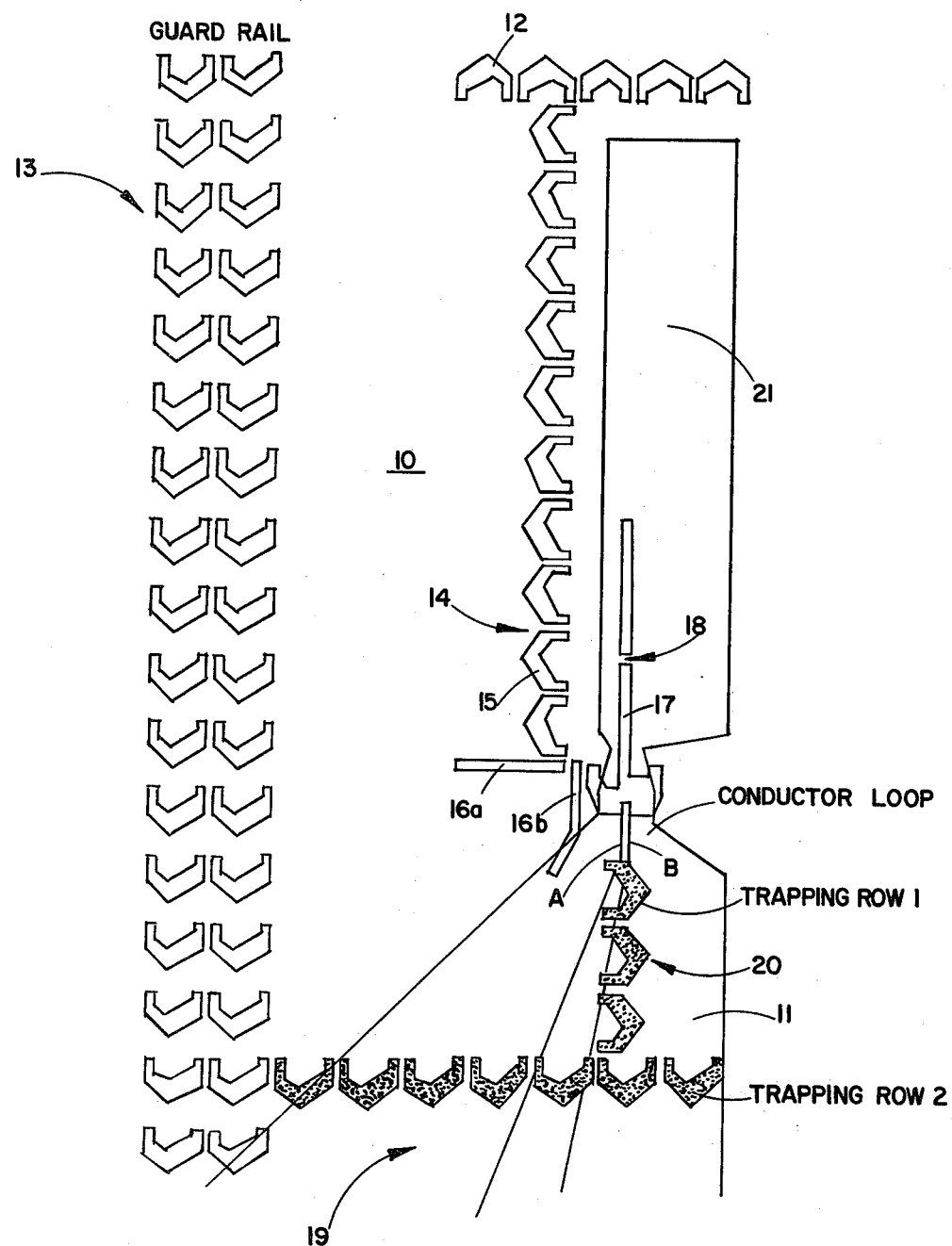

NUCLEATION BUBBLE GENERATOR FOR BUBBLE DOMAIN DEVICES

TECHNICAL FIELD OF THE INVENTION

The invention relates to magnetic bubble domain devices and in particular to bubble domain generator circuits for producing a magnetic bubble in a propagation path.

BACKGROUND OF THE INVENTION

Magnetic bubble domain devices are well known in the art. There are two basic types of devices depending upon the method by which bubbles are propagated in bubble devices; the first is the field access type and the second is the current (or conductor) access type. The most familiar mode of operating a magnetic bubble device is termed the "field-access" mode. In this mode, a pattern of magnetically soft elements (such as Permalloy or ion implanted contiguous disks) is formed in a plane adjacent a layer of material in which the bubbles are moved. A magnetic field is generated in the plane of the layer and the field caused to reorient to incrementally-offset radial positions cyclically in the plane. Each element is so shaped that various portions thereof respond to in-plane field to generate pole-patterns which change as the field processes. The configuration of adjacent elements sets up a sequence of travelling potential wells in the layer which causes bubble movement.

In current access devices, the necessary potential wells are provided by a set of conductor patterns in which polyphase, usually two or three phase, currents are transmitted. The conductors are typically formed in multiple layers, insulated from one another and driven in a two or three phase manner. An example of such a device is described in U.S. Pat. No. 3,460,116.

Various types of magnetic bubble domain device architectures are known in the prior art, one of the best known being the major loop/minor loop configuration. The major loop/minor loop configuration, such as described in the U.S. Pat. No. 3,618,054, consists of a plurality of first recirculating "minor" channels and a second "major" channel.

Many devices have been proposed in the prior art for generating magnetic bubble domains in a magnetic bubble domain material. These devices can be divided into two classes: those which generate bubble domains by replication from an existing bubble domain, and those which initially nucleate a bubble domain in the magnetic bubble material.

Bubble generation is achieved in permalloy field access bubble devices by first stretching an existing bubble, and then cutting it into two parts, typically so that one part is left in the generator region and the second is transferred to a propagation track to represent data in the device. The bubble stretching is performed either by applying a high current pulse to the same conductor used for cutting the bubble or by utilizing some large size permalloy propagation elements such as the pickax element. The prior art nucleation bubble generators exhibit poor reliability at elevated temperatures because of the multibubble nucleation that takes place along the edges of the conductor loop. Although reliability of generator operation can be improved slightly by using current pulses with long decay time, such generators still are disadvantageous in many applications.

One method of nucleating magnetic bubble domains is described in U.S. Pat. No. 3,662,359, which is hereby incorporated by reference.

In such a configuration, control means are connected to the current source for producing a current pulse at a predetermined instant of the re-orienting magnetic drive field so that a localized magnetic field nucleating a bubble domain is produced at the position of the conductor loop portion.

SUMMARY OF THE INVENTION

Briefly and in general terms, the invention concerns a magnetic bubble domain device including a layer of material in which magnetic bubble domains can be moved; a bubble domain generation means coupled to the layer and defining a nucleation source for magnetic bubble domains in the layer, the domains being produced in response to a current pulse; a first bubble domain guide structure coupled to the layer and disposed adjacent the generation means and defining a first bubble domain propagation path for guiding the movement of bubble domains in the layer in response to a cyclical change in orientation of a reorienting field within the plane of the layer. The first guide structure functions to receive bubble domains representative of information generated by the generation means. More particularly, the device further includes a second bubble domain guide structure coupled to the layer and disposed adjacent the generation means and defining a second bubble domain propagation path for ones of the bubbles produced in the layer by the generation means simultaneously with the production of ones of the bubble domains representative of information and transferred to the first bubble domain guide structure.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE DRAWING

The single FIGURE is a top plan view of a bubble domain device which illustrates embodiment of the bubble generator according to the present invention.

DESCRIPTION OF THE PREFERRED EMBODIMENT

The present invention provides a conventional nucleation generator with an additional row of chevron propagating elements called the trapping row that efficiently eliminates the multibubble nucleation, thereby improving the reliability of the generator operation. In addition, this new design removes the need for a special generator pulse, i.e., the design is not sensitive to the decay time of the generator pulse any more. So the implementation of the electronic circuitry driving the bubble generator can be simple.

The single FIGURE shows a top plan view of a magnetic bubble domain device including a nucleation generator comprising a conductor loop. The magnetic bubble domain device according to the present invention is located adjacent a layer of magnetic bubble domain material 10, which can be any material capable of supporting magnetic bubble domains therein, but is preferably a monocrystalline garnet. Adjacent to the layer of magnetic bubble domain material is provided a conductive layer in which various conductive paths are provided. In the present invention, the conductor loop 11 is formed out of such conductor layer. Overlying the conductor layer is a layer of magnetically operative material such as Permalloy which is responsive to a cyclical change in orientation or a re-orienting magnetic field within the plane of the magnetic bubble domain layer so as to create a pattern of moving potential wells in the plane of the layer. The bubble domain guide structures, according to the present invention, are formed out of such layer.

The Permalloy layer is composed of asymmetric chevrons such as the asymmetric chevron 12. In addition, a guardrail 13 is formed from the Permalloy layer which functions to prevent stray magnetic bubbles in the plane of the layer 10 from propagating throughout the magnetic bubble domain device.

A first bubble domain in guide structure 14, shown as a column of asymmetric chevrons 15, is coupled to the layer and adjacent to the nucleation means formed by the conductor loop 11 for transferring the newly formed magnetic bubbles into operative regions of the device. The guide structure 14 consists of Permalloy elements such as asymmetric chevrons 15 as well as bar elements 16a and 16b, as well as the pickax element 17.

The arm of the pickax element 17 if broken in the middle at a point 18 in order to decrease the coercivity of the pickax element. The length of the arm of the pickax element should be relatively long to produce a strong pole at the bottom adjacent to the conductor loop for causing bubble nucleation, but too long a length is disadvantageous since high coercivity is associated with the length of the arm and too high coercivity may result in the Permalloy element not switching with the rotation of the in-plane magnetic field. The serration 18 of the bar is useful for achieving a relatively strong pole at the bottom while minimizing the coercivity. Trapping rows 19 and 20 of Permalloy elements (shown as shaded chevrons to distinguish them in the drawing) are provided for picking up any stray bubbles which are produced along the edges A and B of the conductor loop 11 and function to transfer the bubbles to the guardrail 13 where they are dissipated and do not interfere with the operation of the device.

The FIGURE also shows that the conductor 11 includes a substantial rectangular portion 21 which is used for heat dissipation.

Along the edges A, B of the conductor loop multibubble nucleation takes place if the trapping row is absent. If the design is modified with the trapping row then the magnetic field of the upper most chevron element of this row inhibits the multibubble nucleation. If multibubble nucleation does take place, since the trapping row is connected to the guardrail 13 any bubble that is on the trapping row propagates out into the guardrail 13. With this feature the degrading effects of unwanted bubbles are eliminated, again resulting in an improved reliability of the generator operation.

While the invention has been illustrated and described as embodied in a nucleation bubble domain generator, it is not intended to be limited to the details shown, since various modifications and structural changes may be made without departing in any way from the spirit of the present invention.

It will be obvious to those skilled in the art that the magnetic bubble device according to the present invention can be manufactured with various lithographic technologies and different combinations of known process steps, and that the preferred embodiments illustrated here are merely exemplary. The composition, architecture and geometric configuration of the guide elements, and the layout and distance between the propagation paths, as well as the distance to the magnetic bubble guide elements, as well as their distance to the magnetic bubble layer, can be chosen depending upon the desired properties. These and other variations can be further elaborated by those skilled in the art without departing from the scope of the present invention.

The present invention is also not restricted to the specific magnetic materials and circuits described. For example, it may be pointed out that magnetic materials other than garnet, for example hexagonal ferrites or various crystalline compounds may be used. Moreover, the source, orientation, and frequency of the magnetic field, and the static or dynamic nature of the signals applied to the device may be suitably selected as desired for a particular application.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A magnetic bubble domain device comprising:
a layer of material in which magnetic bubble domains can be moved;
a bubble domain generation means coupled to said layer and defining a nucleation source for magnetic bubble domains in said layer, said generated bubble domains along with possibly unwanted duplicate bubble domains being produced in response to a current pulse;
a first bubble domain guide structure coupled to said layer and disposed directly adjacent said generation means and defining a first bubble domain propagation path for guiding the movement of said generated bubble domains in said layer in response to a cyclical change in orientation or a reorientating field within the place of said layer, said first guide structure functioning to receive said bubble domains representative of information which are generated by said generation means;
characterized in that said device further comprises a second bubble domain guide structure coupled to said layer and disposed directly adjacent said generation means and said first bubble domain guide structure, said second bubble domain guide structure being operative for receiving and guiding the movement of said unwanted duplicate bubble domains produced in said layer by said generation means simultaneously with the production of ones of said generated bubble domains representative of information and transferred to said first bubble domain guide structure.

2. A magnetic bubble domain device defined in claim 1 wherein said generation means comprises a hairpin conductor loop overlying said layer of material in which magnetic domains can be moved, and a Permalloy pickax element having a base portion adjacent the apex of said conductor loop.

3. A magnetic bubble domain device as defined in claim 1 wherein said first bubble domain guide structure comprises a pattern of magnetic elements having a shape generally defined as asymmetrical chevrons.

4. A magnetic bubble domain device as defined in claim 2, wherein said pickax element comprises an arm with a serration therein.

* * * * *